United States Patent [19]

Heaton

[11] Patent Number: 6,052,028
[45] Date of Patent: Apr. 18, 2000

[54] LOW POWER, BIPOLAR, WIDE BANDWIDTH UNITY GAIN BUFFER

[75] Inventor: Dale A. Heaton, Plano, Tex.

[73] Assignee: Texas Instruments Incorporated, Dallas, Tex.

[21] Appl. No.: 09/163,788

[22] Filed: Sep. 30, 1998

Related U.S. Application Data

[60] Provisional application No. 60/060,921, Oct. 3, 1997.

[51] Int. Cl.[7] .................................................. H03F 3/18
[52] U.S. Cl. ........................................ 330/263; 330/267
[58] Field of Search ................................... 330/263, 267, 330/268

[56] References Cited

U.S. PATENT DOCUMENTS

| | | | |
|---|---|---|---|
| 5,179,355 | 1/1993 | Harvey | 330/265 |
| 5,578,967 | 11/1996 | Harvey | 330/263 |
| 5,614,866 | 3/1997 | Dow | 330/267 |

OTHER PUBLICATIONS

Bipolar Process Drives ATE Pin Electronics, John Bond, Test & Measurement World, Apr., 1992, p. 93.
RC7315/RC7315T Three–State ATE Pin Electronics Driver, Raytheon Data Sheet, Jul. 1992, p. 1–2.
200–MHz Pin Driver for ATE for VLSI and memory test: ECL, TTL & CMOS Ad1324 has 2–V/ns slew rate, 200 ps edge match, New–Product Briefs Data Sheet, Analog Dialogue, 1993 p. 27–1.
High–Speed buffer Amplifier, Burr Brown Data Sheet, p. 3.1.3.
250mA High–Speed Buffer, Burr Brown Data Sheet, p. 3.1.18.
Data Sheet of a buffer from Harris Semiconductor.

*Primary Examiner*—Robert Pascal
*Assistant Examiner*—Henry Choe
*Attorney, Agent, or Firm*—Wade James Brady III; Frederick J. Telecky, Jr.

[57] ABSTRACT

The bandwidth of a bipolar complementary emitter follower unity gain buffer is proportionally dependent upon the idle current of the input stage (Q1, Q2) that drives the base nodes of the NPN (Q3) and PNP (Q4) emitter follower output transistors. A high bandwidth typically requires a high idle current. The bandwidth and slew rate of a unity gain buffer are improved without increasing the idle circuit by adding a circuit (Q9–Q12)to sense when a transient is occurring and increasing the positive or negative bias current only during the positive or negative transient. Shunt diodes (Q5, Q6) (base-emitter junctions) can be added across the input transistor emitters to shunt some of the input stage idle current into the opposing current source. This will reduce the idle current at the output stage and reduce the power dissipation of the input stage without sacrificing the available current to drive the base nodes of the output transistors.

10 Claims, 2 Drawing Sheets

LOW POWER, BIPOLAR, WIDE BANDWIDTH UNITY GAIN BUFFER

This application claims priority under 35 USC 119(e)(1) of provisional application No. 60/060,921 filed Oct. 3, 1997.

BACKGROUND OF THE INVENTION

1. Field of the Invention

This invention relates to bipolar unity gain buffers and, more specifically, to such a buffer capable of operation with reduced power consumption relative to prior art bipolar unity gain buffers.

2. Brief Description of the Prior Art

Testing of higher pin count and higher bandwidth integrated circuit logic devices requires a much higher circuit density and power dissipation per unit area than ever previously considered. To increase circuit density, the super small outline package (SSOP) can be used. The power dissipation of this SSOP is much less than the small outline intergrated circuit (SOIC) and plastic leaded chip carrier (PLCC) packages used presently by the automated test equipment (ATE) industry. Innovative changes must be made to improve bandwidth and reduce power dissipation in the ATE pin electronics.

The pin electronics comprises a 3-stateable driver, a dual comparator or receiver and a 3-stateable load. The driver must be capable of driving a series terminated 50 ohm transmission line up to 5 and 8 volt amplitudes at a rate of 5 volts/nanosecond. For the typical A/B class complementary bipolar driver output stage to drive these high amplitudes, the bias current of the output buffer must be increased. The output stage already provides a significant portion of the power dissipation for this device. New circuit designs are therefore required to reduce the power dissipation of the driver output stage and to improve the bandwidth in the same design.

Commercially available bipolar monolithic driver integrated circuits generally use an A/B class output stage. In many prior art drivers, this output stage is a standard A/B complementary bipolar unity gain buffer. In one prior art device, an A/B unity gain buffer is provided having an output stage which senses the output current wherein supplemental current is provided to the output transistor base nodes when a fixed output current is exceeded. This supplemental current is increased after the output current requirement is sensed. This feedback method causes glitches or a stair stepped effect during large voltage swing transients. For an operational amplifier booster, the circuit is adequate. However, for an ATE driver, edge placement accuracy and linear edge speed is required. A glitch or stair stepped effect during the transient could false trigger or double clock a logic device being stimulated during test. It is therefore apparent that an improved buffer and specifically an improved unity gain buffer is highly desirable.

SUMMARY OF THE INVENTION

The above described problem is minimized in accordance with the present invention. Briefly, there is provided a unity gain buffer which senses when a transient is occurring and increases the bias current (linearly proportional to the voltage swing) before the output current is required. This allows a linear input to output voltage swing.

More specifically, the bandwidth of a bipolar complementary emitter follower unity gain buffer is proportionally dependent upon the idle current of the input stage that drives the base nodes of the NPN and PNP emitter follower output transistors. A high bandwidth typically requires a high idle current. The bandwidth and slew rate of a unity gain buffer are improved without increasing the idle circuit by adding a circuit to sense when a transient is occurring and increasing the positive or negative bias current only during the positive or negative transient. Shunt diodes (base-emitter junctions) can be added across the input transistor emitters to shunt some of the input stage idle current into the opposing current source. This reduces the idle current at the output stage and reduces the power dissipation of the input stage without sacrificing the available current to drive the base nodes of the output transistors during a transient.

DESCRIPTION OF THE PREFERRED EMBODIMENT

Figure 1:
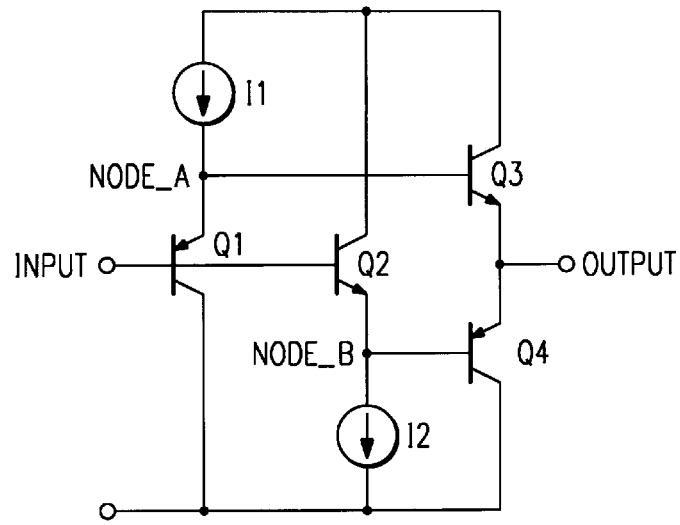
FIG. 1 is a circuit diagram of a typical prior art A/B class complementary emitter follower buffer circuit.

Referring to the FIGURES, wherein like references refer to the same or similar structure and referring first to FIG. 1, there is shown a typical prior art A/B class complementary emitter follower buffer circuit. The bias currents of this buffer are controlled by the constant current sources I1 and I2. Transistor Q1 is the PNP emitter follower input transistor and transistor Q2, which with its constant current source I2 has its current path connected in parallel with the current path of transistor Q1 and its current source I1, is the NPN emitter follower input transistor. Both transistors Q1 and Q2 with their respective current paths are connected across the power source. Node A from the emitter of transistor Q1 is the base node of the NPN output transistor Q3. Node B from the emitter of transistor Q2 is the base node of the PNP output transistor Q4. Transistors Q3 and Q4 are serially connected and are in parallel with transistors Q1 and Q2 and their constant current source. The output signal at the OUTPUT of the circuit, which is the junction of transistors Q3 and Q4, is approximately equal to the signal at the INPUT of the circuit. The output is equal to the input plus the base-emitter voltage of the PNP transistor Q1 plus the base-emitter voltage of the NPN transistor Q2. The base-emitter voltages of transistors Q1 and Q2 are approximately equal and of opposite polarity. Therefore, the signal at the OUTPUT is approximately equal to the signal at the INPUT. When a load is applied to the OUTPUT, the base-emitter voltages of the output transistors Q3 and Q4 are slightly greater in magnitude than the base-emitter voltages of the input transistors. Therefore, with a load applied, the gain of the buffer is slightly less than unity gain.

The slew rate and bandwidth of the typical A/B class complementary emitter follower buffer as shown in FIG. 1 is limited by the time rate of change of the voltage (dv/dt) at Nodes A and B. The dv/dt is determined to be I*C, where C is the lumped capacitance of Node A or Node B and I is equal to the constant current I1 or I2. For a positive transient, the bandwidth is limited to dv/dt=I1*C (at Node A). For a negative transient, the bandwidth is limited to dv/dt=I2 *C (at Node B). Therefore, for the typical prior art A/B class complementary emitter follower buffer circuit, the bandwidth is proportional to and limited by the bias current I1 and I2. To increase bandwidth, I1 and I2 must be increased.

It has been determined that it would be advantageous to increase I1 only during a positive transient and to increase I2 only during a negative transient. This method of controlling the transient currents increases the bandwidth without significantly increasing the power dissipation. This is accomplished with reference to FIG. 2, wherein there is shown a first embodiment of an improved complementary emitter follower buffer in accordance with the present invention. Here the bias currents are controlled by the constant current sources I1 and I2. Transistor Q1 is the PNP emitter follower input transistor and transistor Q2 is the NPN emitter follower input transistor. Node A is the base node of the NPN output transistor Q3 and Node B is the base node of the PNP output transistor Q4, as in FIG. 1. The output signal at OUTPUT is approximately equal to the signal at INPUT plus the base-emitter voltage of PNP transistor Q1 and the base-emitter voltage of NPN transistor Q2 with the base-emitter voltages of transistors Q1 and Q2 being approximately equal and of opposite sign. Therefore, the signal at OUTPUT is approximately equal to the signal at INPUT and the gain of the improved complementary emitter follower buffer is also slightly less than unity gain, as in the prior art.

Figure 2:
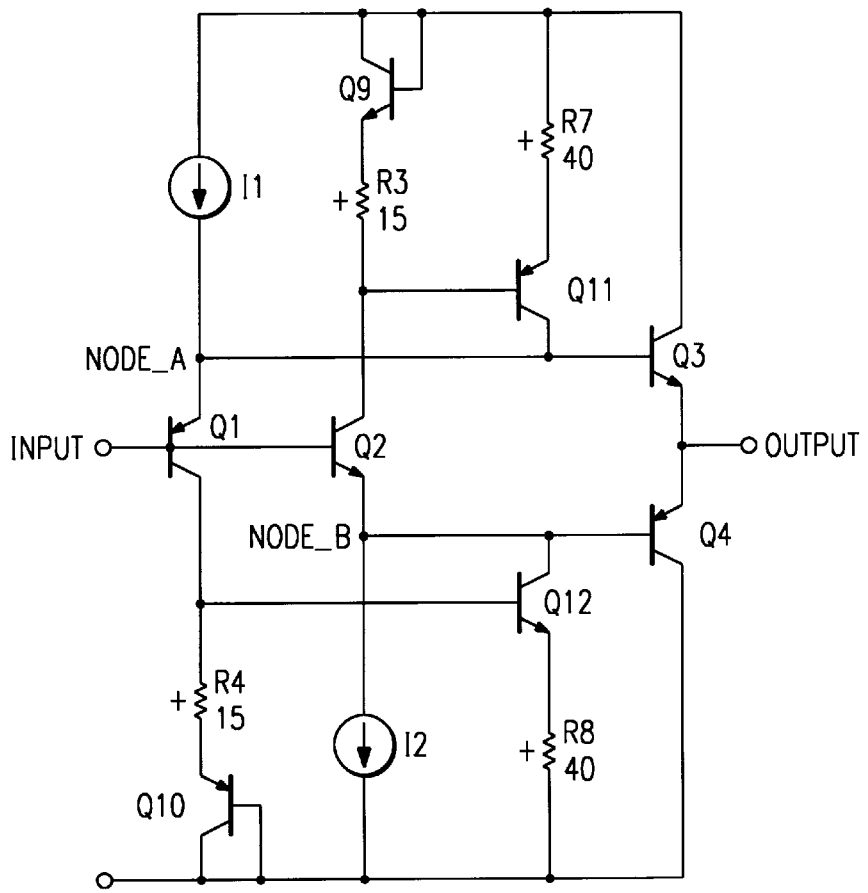
FIG. 2 is a circuit diagram of a first embodiment of an improved A/B class complementary emitter follower buffer circuit in accordance with the present invention.

The slew rate and bandwidth of the improved A/B class complementary emitter follower buffer circuit of FIG. 2 is also limited by the dv/dt of Node A and Node B. The dv/dt is determined to be I*C, where C is the lumped capacitance of Node A or Node B. For this improved buffer circuit, I is equal to the constant current I1 or I2 plus the current provided by the transient sensing circuit that injects positive current during a positive transient and negative current during a negative transient as will be explained hereinbelow.

During a positive transient, the current required into the collector of transistor Q2 increases to charge the lumped capacitance of Node B. This increased collector current of transistor Q2 flows through transistor Q9 and resistor R3, creating a voltage delta equal to the base-emitter voltage of transistor Q9 plus the resistance of resistor R3 multiplied by the I*C of transistor Q2 ($V_{BE}$ (Q9)+R3*I*C(Q2)). The voltage delta is transferred across (or current mirrored) across resistor R7 and the base-emitter voltage of transistor Q11. If the base-emitter voltage of transistor Q11 is approximately equal to the base-emitter voltage of transistor Q9, then R3*I*C(Q2)=R7*I*C(Q11). Therefore, the ratio of injected current (I*C(Q11)) to the collector current of transistor Q2 (I*C(Q2)) is equal to R7/R3. This ratio is chosen such that the current in the emitter of transistor Q1 does not equal or cross through zero amperes during the largest and highest slew rate voltage swing required. If the current through the emitter of transistor Q1 equals or crosses through zero amperes, the emitter follower circuit is slew rate and bandwidth limiting the input to output signal.

During a negative transient, the current required into the collector of transistor Q1 increases to charge the lumped capacitance of Node B. This increased collector current (Ic) of transistor Q1 flows through transistor Q10 and resistor R4, creating a voltage delta equal to the base-emitter voltage of transistor Q10 plus R4*Ic(Q1). The voltage delta is transferred across (or current mirrored across) resistor R8 and the base-emitter voltage of transistor Q11. If the base-emitter voltage of transistor Q11 is approximately equal to the base-emitter voltage of transistor Q9, then R3*Ic(Q2)= R7*Ic(Q12). Therefore, the ratio of injected current (IC (Q12)) to the collector current of transistor Q1 (Ic(Q1)) is equal to R8/R4. This ratio is chosen such that on a largest and highest slew rate voltage swing required, the current in the emitter of transistor Q2 does not equal or cross through zero amperes. If the current through the emitter of transistor Q2 equals or crosses through zero amperes, the emitter follower circuit is slew rate and bandwidth limiting the input to output signal.

Figure 3:
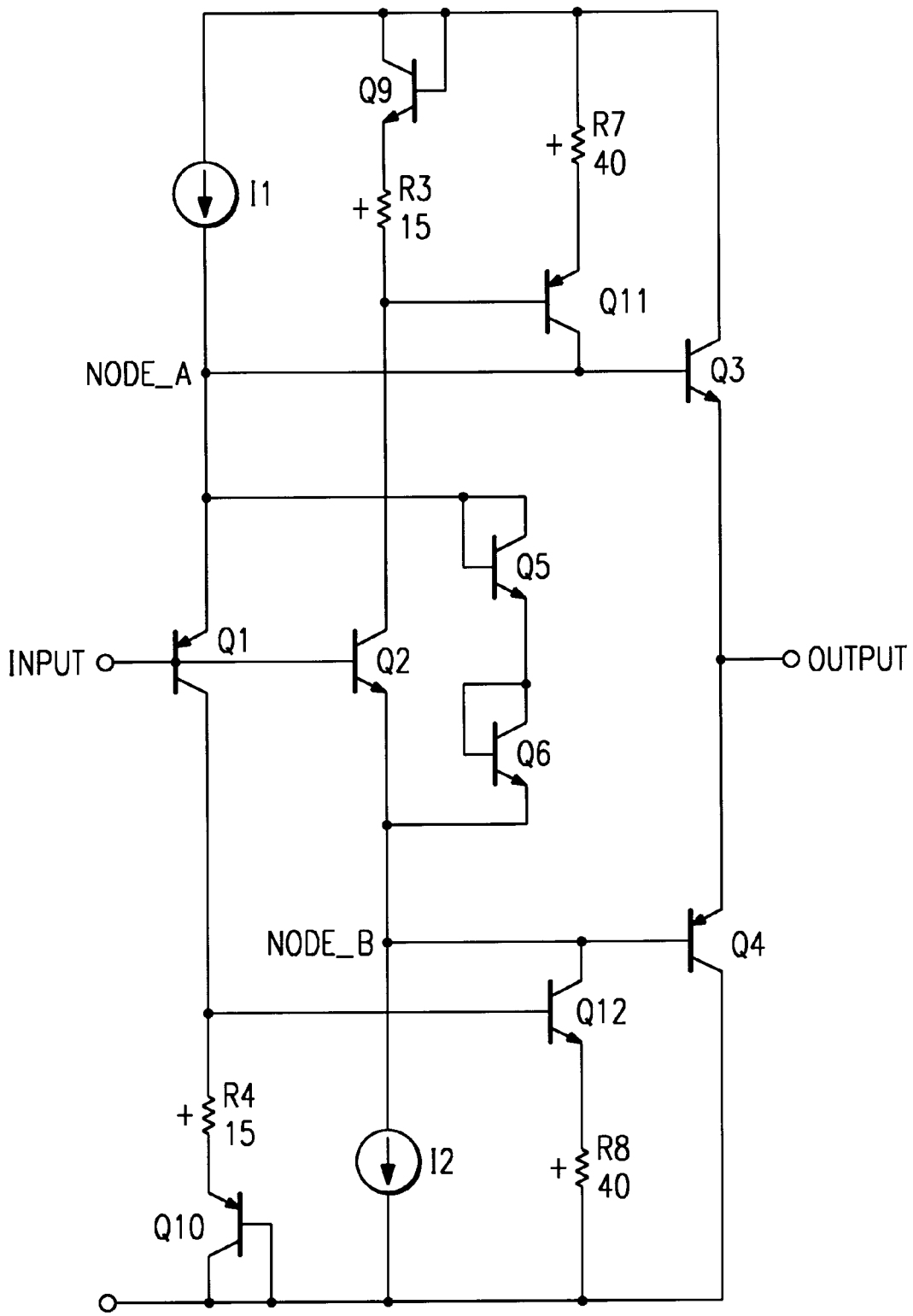
FIG. 3 is a circuit diagram of a second embodiment of an improved complementary emitter follower buffer circuit with shunt transistors in accordance with the present invention.

FIG. 3 shows an improved A/B class complementary emitter follower buffer with added shunt transistors Q5 and Q6 in accordance with the present invention. The base emitter junctions of transistors Q5 and Q6 creating diode junctions are connected across the emitters of transistors Q1 and Q2 to reduce power dissipation. Transistors Q5 and Q6 reduce power dissipation without reducing bandwidth or slew rate as described hereinbelow. Some of the current that would normally flow through transistors Q1 and Q2 is shunted through transistor Q5 and Q6. This reduces the collector current of transistors Q1 and Q2, but does not reduce the current into Nodes A and B. The equation dv/dt=I*C is maintained, although the collector currents of transistors Q1 and Q2 are reduced. In addition, the base-emitter voltages of transistors Q1 and Q2 are also reduced because the emitter currents of transistors Q1 and Q2 are reduced. The base-emitter voltages of transistors Q1 and Q2 control the bias current of the output stage. The bias currents of transistors Q3 and Q4 are proportional to the bias current through transistor Q1 and Q2. Accordingly, the base-emitter voltages of transistors Q1 and Q3 will be equal to the base-emitter voltages of transistors Q3 and Q4.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

I claim:

1. A buffer circuit which comprises:
    (a) an input terminal;
    (b) a pair of complementary input transistors, each having a control electrode coupled to said input terminal;
    (c) a pair of serially connected complementary output transistors, each having a control electrode coupled to the emitter of a different one of said input transistors;
    (d) an output terminal coupled to the junction of said output transistors;
    (e) transient sensing means responsive to sensing of one of a positive or negative transient to inject a current to only a particular one of said input transistors determined by the direction of said transient which includes a first sensing transistor of the same conductivity type and a first resistor and coupled in series with one of said input transistors and a second sensing transistor of the same conductivity type and a second resistor coupled in series with the other of said input transistors; and
    (f) a mirror circuit mirroring each of said combinations of sensing transistor and associated resistor coupled across the control electrode and the electron collecting electrode of a different one of said output transistors.

2. A buffer circuit which comprises:
    (a) an input terminal;
    (b) a pair of complementary input transistors, each having a control electrode coupled to said input terminal;
    (c) a pair of serially connected complementary output transistors, each having a control electrode coupled to the emitter of a different one of said input transistors;

(d) an output terminal coupled to the junction of said output transistors; and (e) including a shunt transistor or diode coupled between the electron emitting electrodes of said input transistors.

3. A buffer circuit which comprises:

(a) an input terminal;

(b) a pair of complementary input transistors, each having a control electrode coupled to said input terminal; (c) a pair of serially connected complementary output transistors, each having a control electrode coupled to the emitter of a different one of said input transistors;

(d) an output terminal coupled to the junction of said output transistors;

(e) transient sensing means responsive to sensing of one of a positive or negative transient to inject a current to only a particular one of said input transistors determined by the direction of said transient; and (f) a shunt transistor or diode coupled between the electron emitting electrodes of said input transistors.

4. The circuit of claim 1 further including a separate constant current source serially connected to each of said input transistors, each of said input transistors with its current source coupled in parallel with the other input transistor with its current source.

5. The circuit of claim 1 wherein said serially connected output transistors are connected in parallel with each of said input transistors with its constant current source and said transient sensing means.

6. The circuit of claim 4 wherein said serially connected output transistors are connected in parallel with each of said input transistors with its constant current source and said transient sensing means.

7. The circuit of claim 3 further including a separate constant current source serially connected to each of said input transistors, each of said input transistors with its current source coupled in parallel with the other input transistor with its current source.

8. The circuit of claim 7 wherein said serially connected output transistors are connected in parallel with each of said input transistors with its constant current source and said transient sensing means.

9. The circuit of claim 8 wherein said transient sensing circuit includes a first sensing transistor of the same conductivity type and a first resistor and coupled in series with one of said input transistors and a second sensing transistor of the same conductivity type and a second resistor coupled in series with the other of said input transistors.

10. The circuit of claim 9 further including a mirror circuit mirroring each of said combinations of sensing transistor and associated resistor coupled across the control electrode and the electron collecting electrode of a different one of said output transistors.

* * * * *